(12) United States Patent
Louie et al.

(10) Patent No.: US 9,947,395 B2
(45) Date of Patent: *Apr. 17, 2018

(54) PROGRAMMING TECHNIQUES FOR NON-VOLATILE MEMORIES WITH CHARGE TRAPPING LAYERS

(71) Applicant: SANDISK TECHNOLOGIES LLC, Plano, TX (US)

(72) Inventors: Kenneth Louie, Sunnyvale, CA (US); Man Mui, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/486,512

(22) Filed: Apr. 13, 2017

(65) Prior Publication Data

US 2017/0221556 A1   Aug. 3, 2017

Related U.S. Application Data

(63) Continuation of application No. 14/635,918, filed on Mar. 2, 2015, now Pat. No. 9,627,046.

(51) Int. Cl.
| | |
|---|---|
| *G11C 16/04* | (2006.01) |
| *G11C 11/56* | (2006.01) |
| *G11C 16/34* | (2006.01) |
| *G11C 16/08* | (2006.01) |

(52) U.S. Cl.
CPC .......... *G11C 11/5671* (2013.01); *G11C 16/08* (2013.01); *G11C 16/3459* (2013.01)

(58) Field of Classification Search
CPC ...................................................... G11C 16/32

USPC ..................................................... 365/185.19
See application file for complete search history.

(56) References Cited

U.S. PATENT DOCUMENTS

| | | | |
|---|---|---|---|
| 8,933,516 B1 | 1/2015 | Wu et al. | |
| 9,318,204 B1* | 4/2016 | Chen | G11C 16/10 |
| 2007/0030732 A1 | 2/2007 | Micheloni et al. | |
| 2013/0016566 A1 | 1/2013 | Hemink | |
| 2013/0088924 A1 | 4/2013 | Nawata | |
| 2014/0269057 A1 | 9/2014 | Shereshevski et al. | |
| 2015/0255166 A1 | 9/2015 | Tseng et al. | |
| 2016/0099059 A1* | 4/2016 | Chen | G11C 16/10 365/185.17 |

OTHER PUBLICATIONS

Non-Final Office Action issued on U.S. Appl. No. 14/635,918, dated Aug. 18, 2016.

* cited by examiner

*Primary Examiner* — Hoai V Ho

(74) *Attorney, Agent, or Firm* — Foley & Lardner LLP

(57) ABSTRACT

Techniques are presented for the programming of a non-volatile memory in which multi-state memory cells use a charge trapping layer. When writing data onto a word lines, different data states are written individually, while programming inhibiting the other states, thereby breaking down the write operation into a number of sub-operations, one for each state to be written. This allows for improved timing and decreased power consumption.

20 Claims, 19 Drawing Sheets

Example Progam/Verify voltages on a Word Line

Setting the Bit Line to a program-enabled voltage

Setting the Bit Line to a program-inhibited voltage

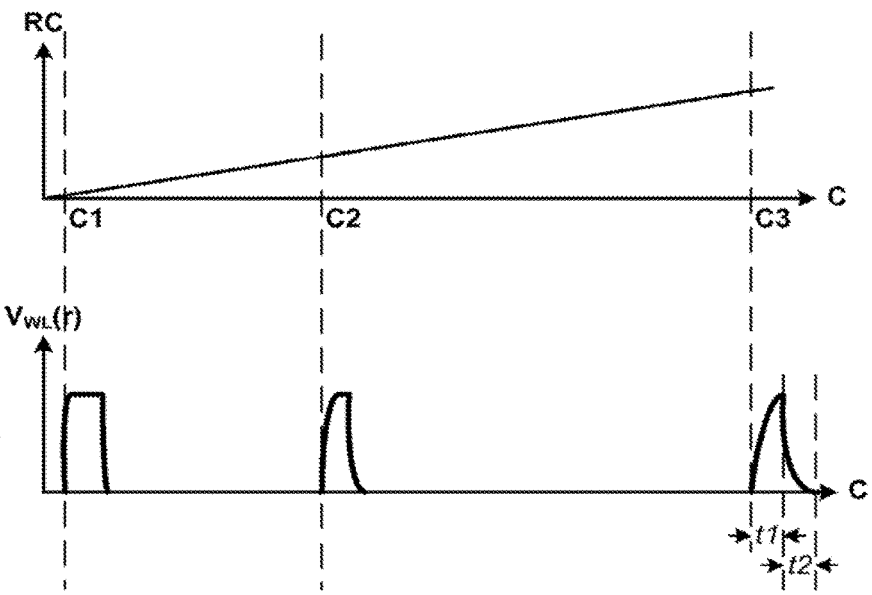
FIG. 10A
FIG. 10B
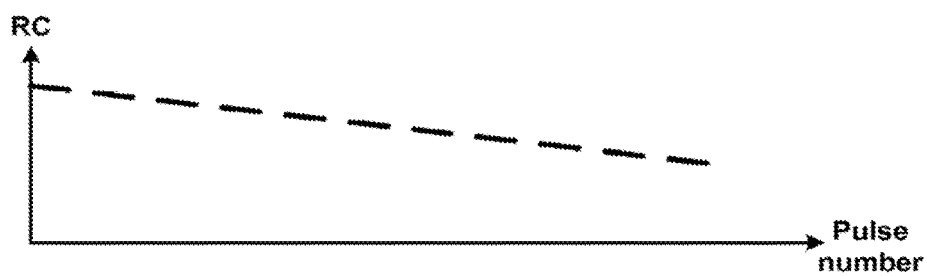
FIG. 11A
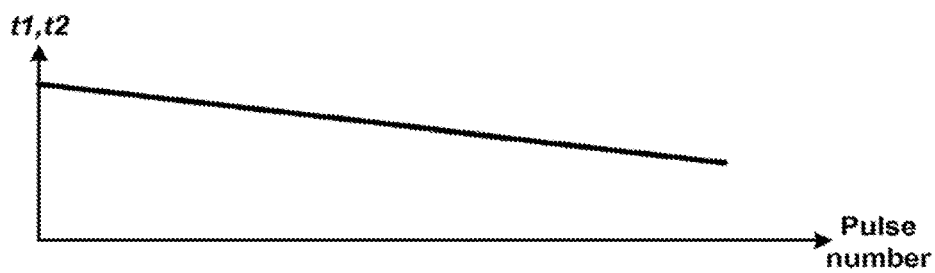
FIG. 11B

PROGRAMMING TECHNIQUES FOR NON-VOLATILE MEMORIES WITH CHARGE TRAPPING LAYERS

CROSS-REFERENCE TO RELATED PATENT APPLICATIONS

This application is a continuation of U.S. application Ser. No. 14/635,918, filed on Mar. 2, 2015, the entirety of which is incorporated by reference herein.

BACKGROUND

This application relates to two- or three-dimensional memory systems such as semiconductor flash memory which record data using charge stored in charge storage elements of re-programmable nonvolatile memory cells, and more particularly to programming techniques for such memories.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

Methods are presented for the operating of a non-volatile memory circuit having an array of memory cells each having a dielectric charge storage medium, a plurality of which are formed along a first word line. The method includes performing a programming operation to program a plurality of memory cells along the first word line from an initial state to one of a plurality of programmed states, the programmed states including first and second programmed states, where at least one of the memory cells along the first word line are to be programmed to each of the first and second programmed states. The programming operation includes a first programming sub-operation and a subsequent second programming sub-operation. The first programming sub-operation includes: program inhibiting all memory cells not to be programmed to the first programmed state; program enabling all memory cells to be programmed to the first programmed state; and applying a series of programming pulses along the first word line, alternating with a set of verify operations for the memory cells to be programmed to the first programmed state, wherein programmed enable memory cells that verify at the first programmed state are subsequently inhibited for subsequent programming pulses. The second programming sub-operation includes: program inhibiting all memory cells not to be programmed to the second programmed state; program enabling all memory cells to be programmed to the second programmed state; and applying a series of programming pulses along the first word line, alternating with a set of verify operations for the memory cells to be programmed to the second programmed state, wherein programmed enable memory cells that verify at the second programmed state are subsequently inhibited for subsequent programming pulses.

A non-volatile memory circuit has an array of memory cells each having a dielectric charge storage medium, a plurality of which are formed along a first word line, and programming and sensing circuitry connectable to the array. When performing a programming operation to program a plurality of memory cells along the first word line from an initial state to one of a plurality of programmed states, the programmed states including first and second programmed states, where at least one of the memory cells along the first word line are to be programmed to each of the first and second programmed states, the programming operation includes a first programming sub-operation and a second, subsequent programming sub-operation. The first programming sub-operation includes: program inhibiting all memory cells not to be programmed to the first programmed state; program enabling all memory cells to be programmed to the first programmed state; and applying a series of programming pulses along the first word line, alternating with a set of verify operations for the memory cells to be programmed to the first programmed state, wherein programmed enable memory cells that verify at the first programmed state are subsequently inhibited for subsequent programming pulses. The second programming sub-operation includes: program inhibiting all memory cells not to be programmed to the second programmed state; program enabling all memory cells to be programmed to the second programmed state; and applying a series of programming pulses along the first word line, alternating with a set of verify operations for the memory cells to be programmed to the second programmed state, wherein programmed enable memory cells that verify at the second programmed state are subsequently inhibited for subsequent programming pulses.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 10A illustrates the product of resistance and capacitance for a given segment of the word line being proportional to the capacitance.

FIG. 10B illustrates the response of a programming pulse for the three values of Cs shown in FIG. 10A.

FIG. 11A illustrates schematically the variation of the effective RC constant of a word line with pulse number during programming.

FIG. 11B illustrates schematically the variation of the timing delay of a word line with pulse number during programming.

DETAILED DESCRIPTION

Memory System

Figure 1:
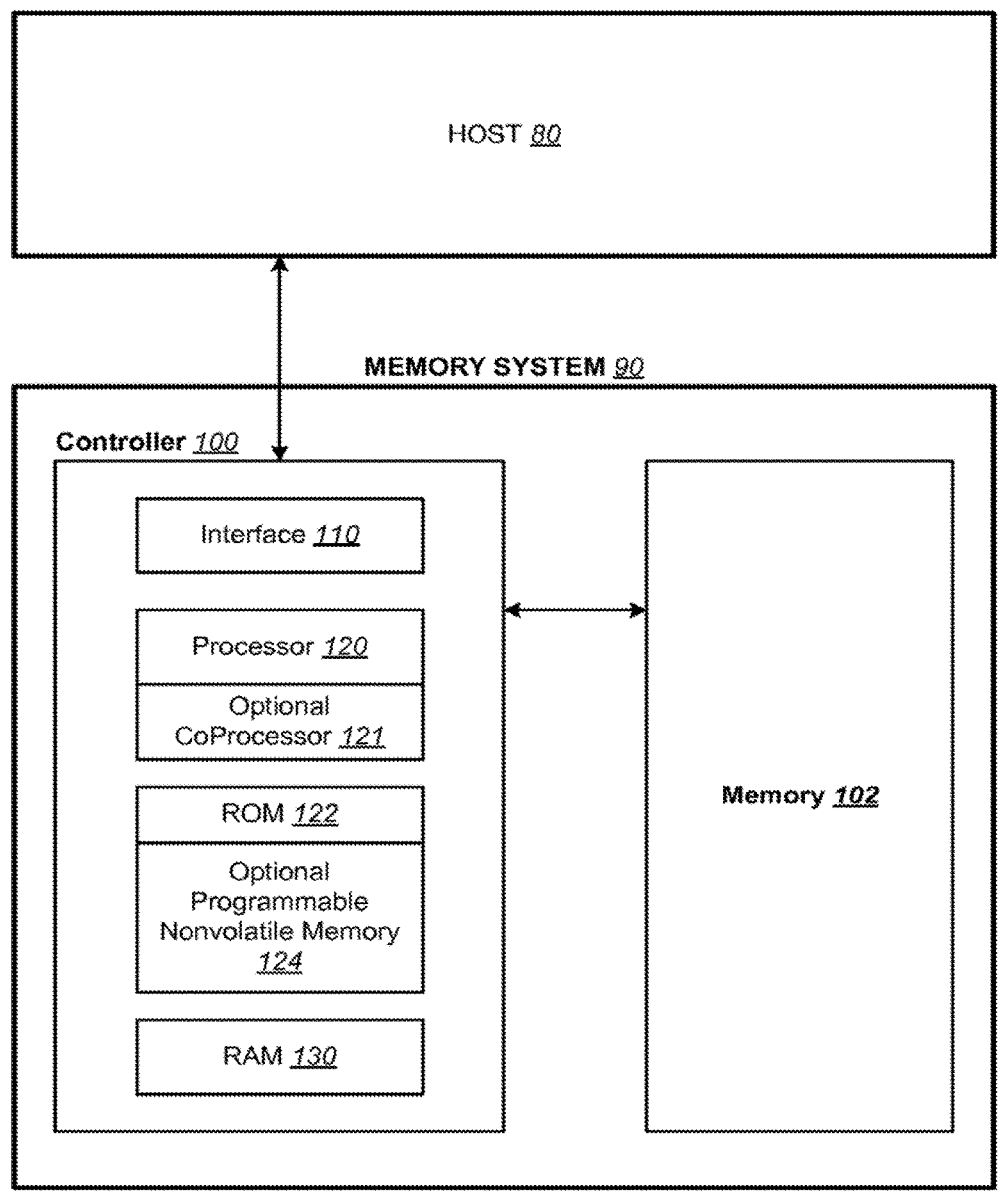
FIG. 1 illustrates schematically the main hardware components of a memory system suitable for implementing the present subject matter.

FIG. 1 illustrates schematically the main hardware components of a memory system suitable for implementing the present subject matter. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
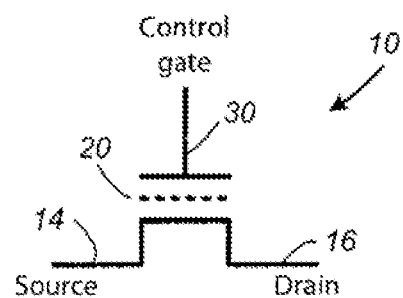
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage element 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
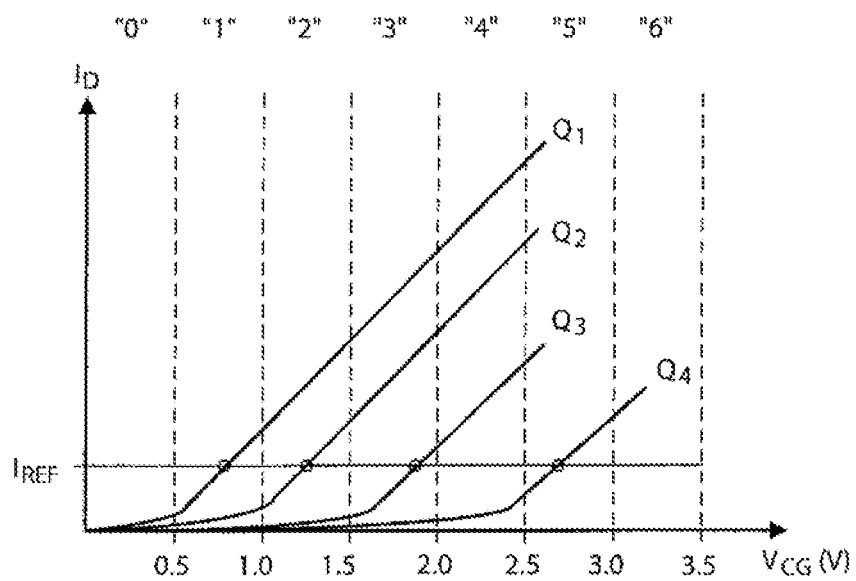
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, $I_{REF}$ of 2 .μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
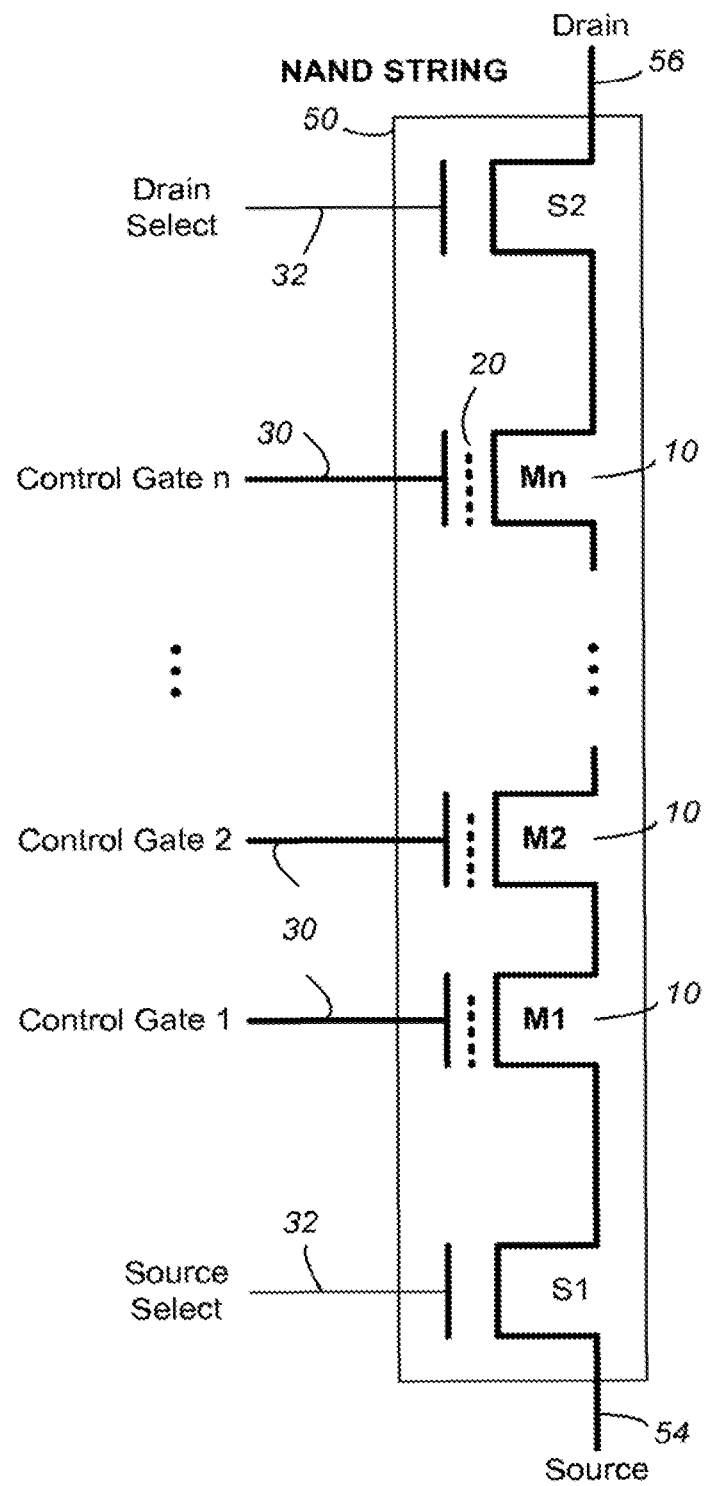
FIG. 4 illustrates schematically a daisy chain of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
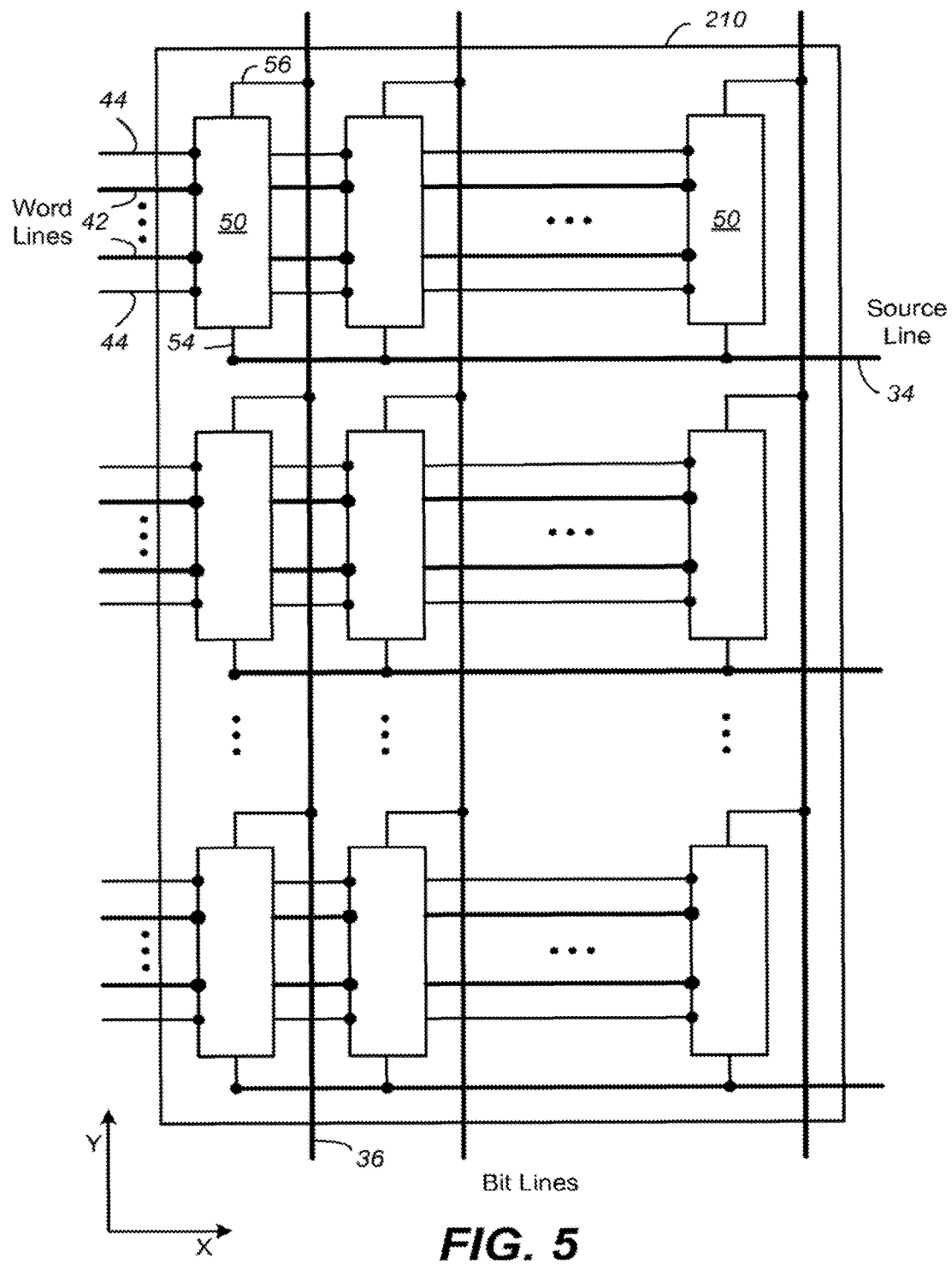
FIG. 5 illustrates an example of a NAND array of memory cells, constituted from NAND strings such as that shown in FIG. 4A.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
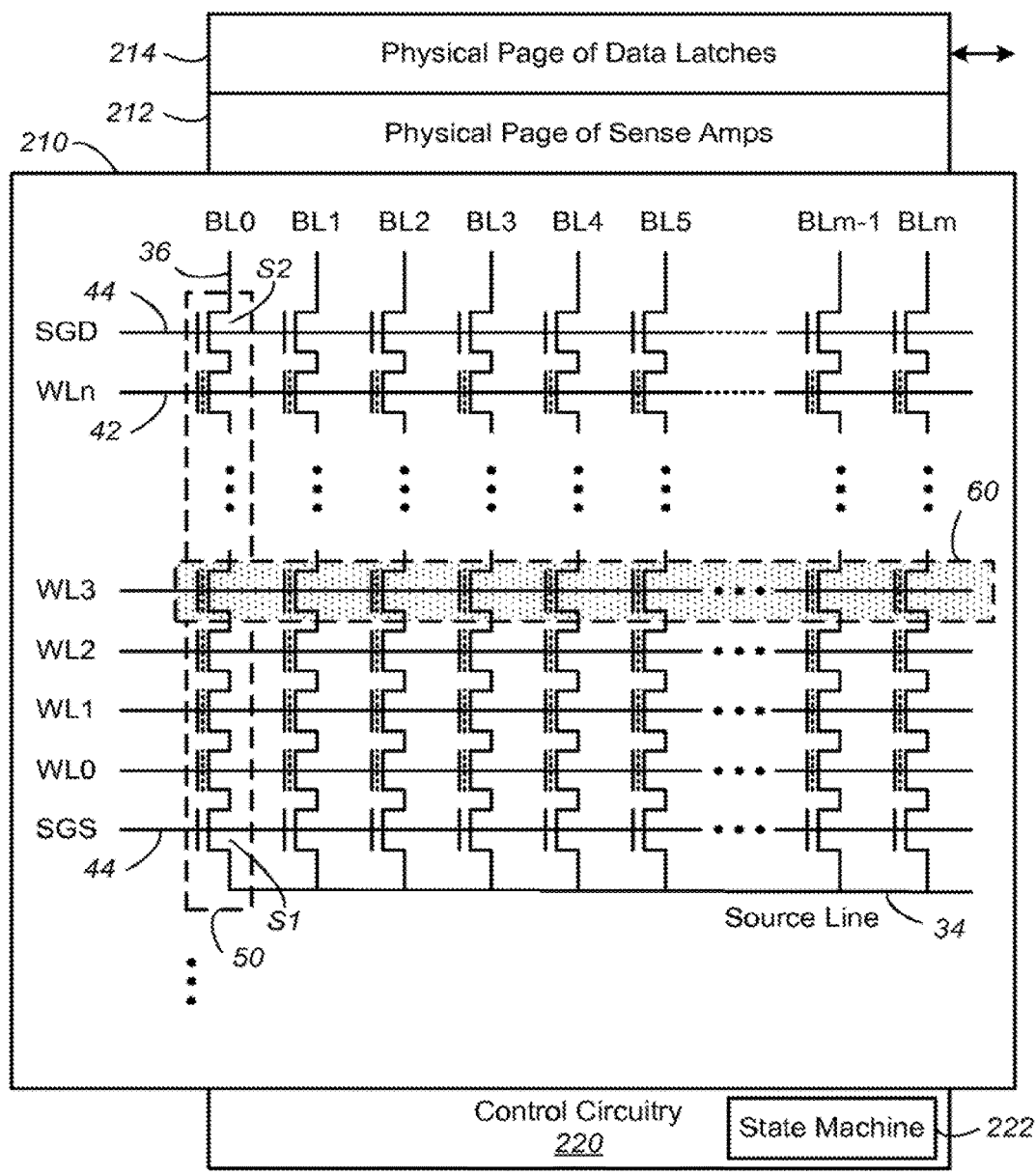
FIG. 6 illustrates a 2D NAND memory in the x-y plane.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines. A chip-level control circuitry 220 has a state machine 222 that controls the memory operations.

Physical Organization of the Memory

One difference between flash memory and other of types of memory is that a cell is programmed from the erased state. That is, the floating gate is first emptied of charge. Programming then adds a desired amount of charge back to the floating gate. It does not support removing a portion of the charge from the floating gate to go from a more programmed state to a lesser one. This means that updated data cannot overwrite existing data and is written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
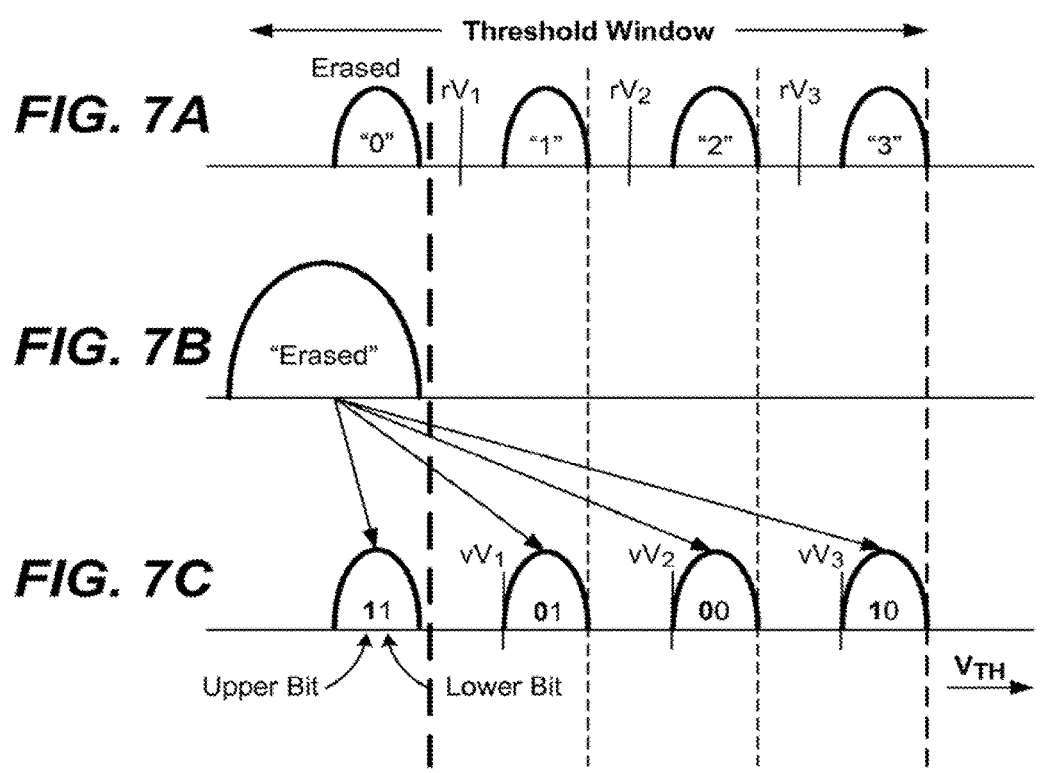
FIG. 7A illustrates the population of memory cells programmable into four distinct distributions of threshold voltages respectively representing memory states "E", "A", "B" and "C".
FIG. 7B illustrates the initial distribution of "erased" threshold voltages for an erased memory.
FIG. 7C illustrates an example of the memory after many of the memory cells have been programmed.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Programming a Group of Memory Cells in Parallel

As explained earlier, to improve performance, a group (i.e., page 60, see FIG. 6) of memory cells are programmed in parallel. The group of memory cells has their control gates connected to a common word line 42 and has the drain terminals 36 connected to a sense amplifier 212 via a respective bit line 36. Prior to programming the group of memory cells is first erased as part of an erase block.

Figure 8:
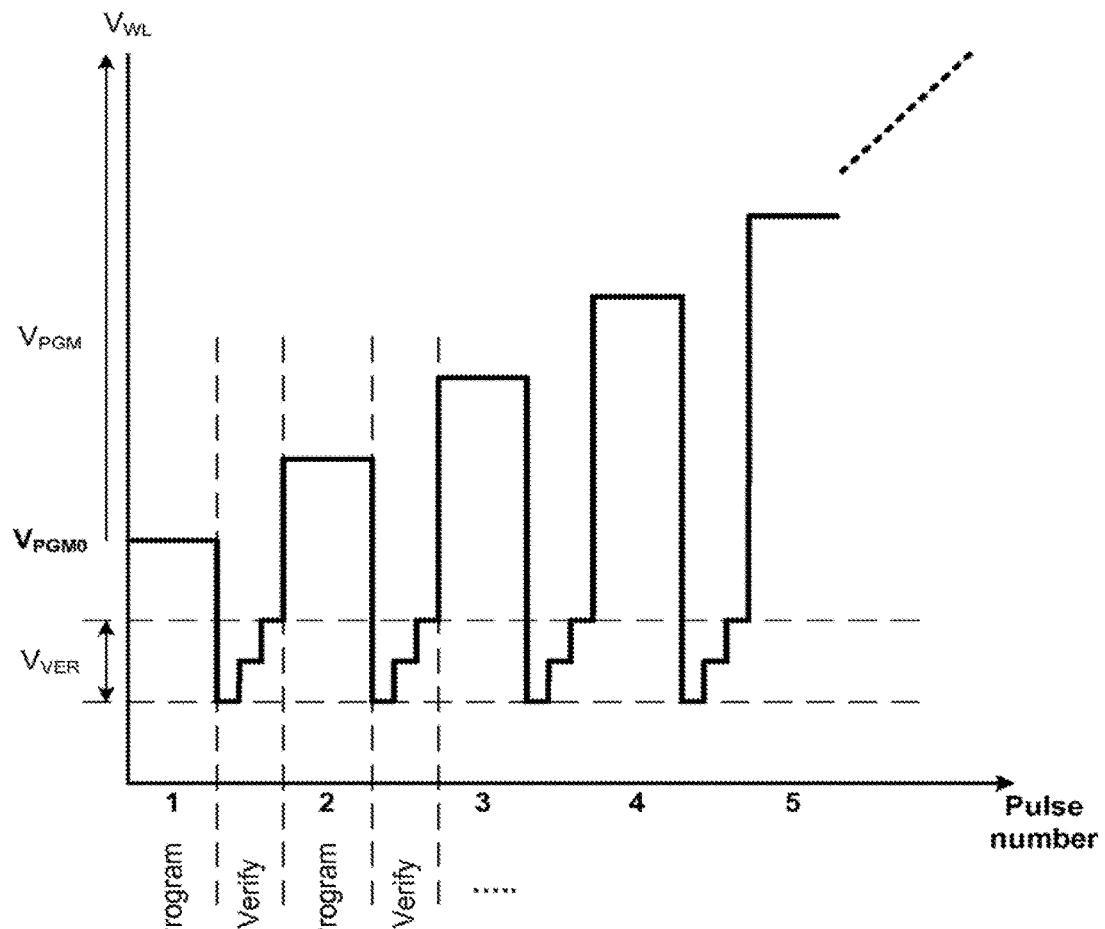
FIG. 8 illustrates a series of programming voltage pulses in the form of a staircase waveform being applied to a selected word line.

FIG. 8 illustrates a series of programming voltage pulses in the form of a staircase waveform being applied to a selected word line. When a cell is being programmed to a given state, it is subject to successive programming voltage pulses, each time attempting to add incremental charges to the charge storage element. In between programming pulses, the cell is read back or verified to determine its source-drain current relative to a breakpoint level. Programming stops for a cell when it has been verified to reach the desired state. The programming pulses typically have increasing amplitude in order to counteract the accumulating electrons programmed into the charge storage element of the memory cell. Programming circuits generally apply, in a programming loop, a series of programming pulses to a selected word line. In this way, a page of memory cells whose control gates are connected to the word line can be programmed together. Whenever a memory cell of the page has been programmed to its target state, it is program-inhibited while the other memory cells continue to be subject to programming until all memory cells of the page have been program-verified. Thus, prior to programming a page, a number of memory cells in the page are slated to be programmed and they are enabled for programming. As the pulse number increases, more and more of the memory cells have been programmed to their target state and are then put into a program-inhibited state until all memory cells have been programmed.

To prevent memory cells in the group that have been verified from being programmed further while the programming loop is still on-going, these cells are program-inhibited while the remaining memory cells that have yet to be verified are program-enabled.

Figure 9A:
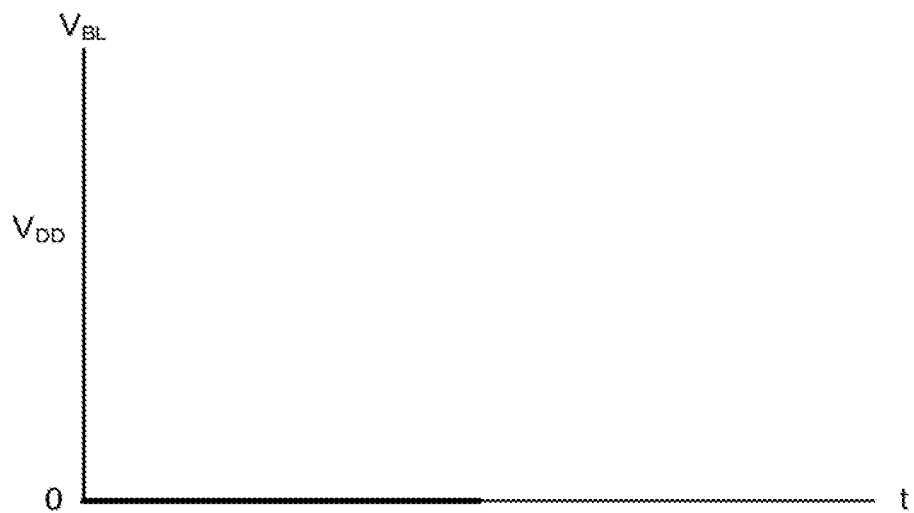
FIG. 9A illustrates putting the memory cell in a program-enabled state by setting the respective bit line voltage to zero.

FIG. 9A illustrates putting the memory cell in a program-enabled state by setting the respective bit line voltage to zero. Referring also to FIG. 6, in operation the page of NAND strings associated with bit lines BL0 to BLm has the gates of drain-side transistor switches S2 set to SGD=Vdd. When a bit line is biased to VBL=0V, the drain-side transistor switch for that bit line is turned on, which also results in the channel of the NAND string to be at 0V. This is a program-enabled state because, when a programming voltage is applied to a selected word line, the maximum programming voltage is developed between the word line and the channel. This creates a favorable condition for charges to tunnel from the channel to the charge storage element 20 between the channel and the word line.

Figure 9B:
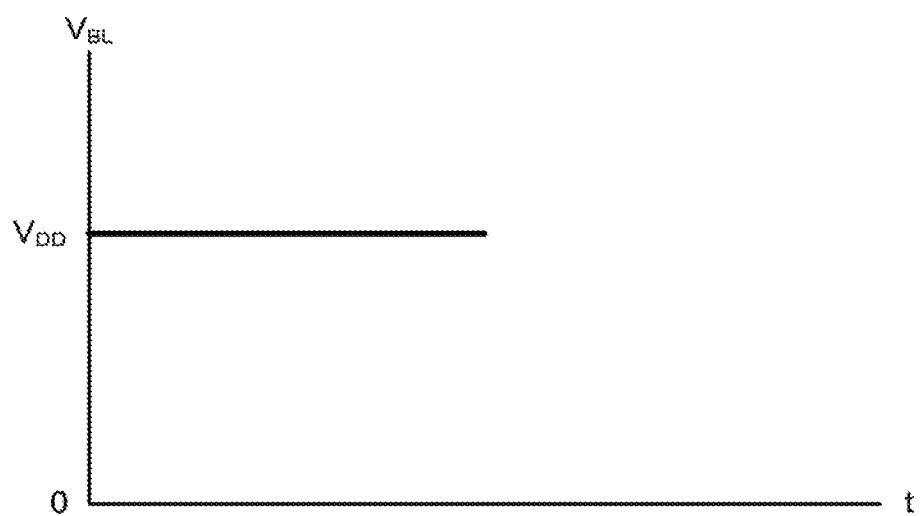
FIG. 9B illustrates putting the memory cell in a program-inhibited state by setting the respective bit line voltage to a voltage that disconnect the memory cell from the bit line.

FIG. 9B illustrates putting the memory cell in a program-inhibited state by setting the respective bit line voltage to a voltage that disconnect the memory cell from the bit line. Referring also to FIG. 6, in operation the page of NAND strings associated with bit lines BL0 to BLm has the gates of drain-side transistor switches S2 set to SGD=Vdd, which is a standard CMOS supply voltage. When a bit line is biased to VBL=Vdd, the drain-side transistor switch for that bit line is turned off, which cuts off the NAND string from the associated bit line and results in the channel of the NAND string to be floated. This is a program-inhibited state because, when a programming voltage is applied to a selected word line, the floated channel acquires a boosted voltage due to capacitive coupling with the programming voltage at the word line. Therefore the voltage between the channel and the word line is reduced, creating an unfavorable condition for charges to tunnel from the channel to the charge storage element 20 between the channel and the word line.

Timing of Programming Pulses

The programming voltage pulses shown in FIG. 8 are schematic in that the ramp up and ramp down of each square pulse are instantaneous. In practice, the word line has a finite capacitance and resistance. Bringing the word line to a specified voltage amounts to charging a capacitor, which will take finite time. Similarly, it will take time to discharge the specified voltage to zero. It will be described below that the time of charging and discharging is determined by an RC constant of the word line, where R and C are respectively the resistance and capacitance of the word line.

FIG. 10A illustrates the product of resistance and capacitance (RC constant) for a given segment of the word line being proportional to the capacitance. In general, the resistance of a segment of word line is proportional to the length of the segment. On the other hand, the capacitance of a segment is substantially independent of its length. Three increasing values of the capacitance, C1, C2 and C3 are distinguished for comparison.

FIG. 10B illustrates the response of a programming pulse for the three values of Cs shown in FIG. 10A. When an individual programming pulse (see FIG. 6) is supplied to an access node 46 to the word line (see FIG. 12), it essentially encounters an RC circuit. In general, assuming the variation of R across the word line is insignificant; the value of RC is constant. The word line voltage $V_{WL}$ is a response to the input programming pulse. The response is a charging up of the word line with time constant given by RC. The charged up voltage as a function of time t is $V_{WL}(t)=V_{WL}[1-EXP(-t/RC)]$. The discharged voltage at time t is $V_{WL}(t)=V_{WL} EXP(-t/RC)$. In other word, the product RC is a time constant that determines the rate of charging or discharging of the word line. After one unit of time constant, the word line will be charged to 63.2 percent. After two units of time constant, the word line will be charged to 86.5 percent, etc. Thus, the greater the RC, the slower will the charging and discharging be. For a rectangular programming pulse, the word line will be charging with the rising edge of the pulse and will be discharging with the falling edge of the pulse.

The effect of the RC variation is that for a word line with larger C, the RC delay is larger and therefore the efficacy of the programming pulse is diminished. Thus, the timing of each programming pulse must allow for the ramp up time t1 and the ramp down time t2.

Conventionally, pulses at any pulse number have the same timing, allowing for the worst-case (longest delay). This has two disadvantages. First, the read performance is reduced. Second, there are more program disturb. This is owing to minimizing the time for the program-inhibited memory cells has to hold the boosted voltage during programming, which has a tendency to leaking away, thereby reducing their program-inhibition efficacy and causing unwanted programming.

Variation of the Word Line Capacitance During Programming

In general the capacitance of a word line seen by a word line driver 232 (see FIG. 12) is the sum of the capacitance contributed by the word line plus all the NAND channels of the page of NAND strings. For example, when a NAND channel is connected to a bit line that has been set to 0V (as in a program-enabled mode), the NAND channel may be regarded as a ground plate of a capacitor and the word line as the other plate of the capacitor. On the other hand, in the program-inhibited mode, the NAND channel is disconnected from the bit line and is floating, so there is no such capacitor. Thus, the effective total capacitance of the word line is the sum of the capacitance contributed by the word line plus all the NAND channels of NAND strings that are programmed enabled.

Programming with Adaptive Timing Dependent on the Relative Proportions of Program-Enabled and Program-Inhibited Memory Cells in a Page FIG. 11A illustrates schematically the variation of the effective RC constant of a word line with pulse number during programming. As described earlier, when programming a page in parallel, the page initially has a number of memory cells not needing to be programmed and they are put in a program-inhibited mode. At the same time the remaining memory cells of the page are slated to be programmed and they are put in a program-enabled mode. As the programming proceeds with increasing pulse number, the remaining program-enabled memory cells become programmed and change to program-inhibited memory cells. At the end of the programming loop, essentially all memory cells of the page will be program-inhibited memory cells. Thus, the effective total capacitance of the word line decreases with every conversion of a programmed-enable memory cell to a programmed inhibited memory cell. It has been estimated that the difference of the effective total capacitance of the word line could change by 50% during the course of the programming loop. The variation of the capacitance C during programming is especially significant with NAND memory architecture where there are many memory cells daisy-chained on each NAND string.

FIG. 11B illustrates schematically the variation of the timing delay of a word line with pulse number during programming. Since the timing, such as t1 and t2 are dependent on the RC constant, the graph of FIG. 11B essentially tracks that of FIG. 11A.

Programming a group of non-volatile memory cells on a word line typically involves applying a series of programming pulses of increasing voltage level to the word line. Owing to a finite RC constant of the word line, it takes time to charge and discharge the word line to predetermined voltage levels. The timing of the pulses must allow for delays due to the RC constant. Conventionally, a worst-case timing is applied to all pulses, resulting in less than optimum programming performance and increased program disturb.

Each memory cell has a channel from which charges are pulled to a charge storage element by a programming voltage on the word line. In the case of a NAND memory, the channel is across an entire NAND string. An effective word line capacitance is dependent on the sum of word line to channel capacitance contributed from each memory cell of the group being programmed in parallel. However, when a memory cell has been programmed to its target state, it is put in a program-inhibited state to prevent further programming by additional pulses. This is accomplished by disconnecting the memory cell from the bit line which also results in its contribution to the effective word line capacitance being discounted.

The present device and method allow for individual timing of the programming pulses. The rise and fall times of the pulse is optimally and dynamically adjusted according to the relative numbers of program-enabled and program-inhibited memory cells in the group associated with that pulse.

In another embodiment, the relative numbers of program-enabled and program-inhibited memory cells in the group associated with that pulse could be estimated as a function of the pulse number, as is illustrated in FIG. 11A and FIG. 11B. This is possible if the data to be programmed is first scrambled (as is usually the practice for other considerations) to avoid unusual data pattern skewing the functional dependency.

Figure 12:
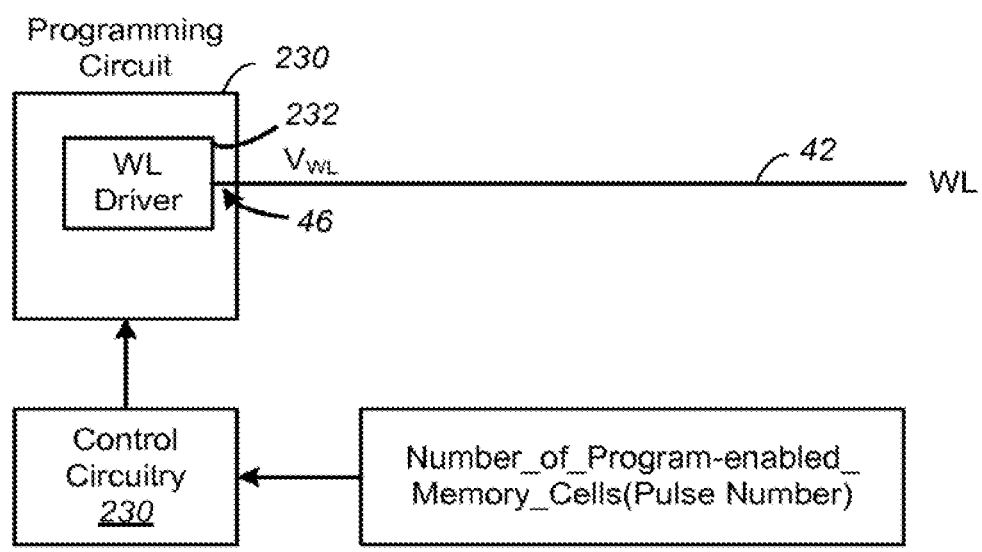
FIG. 12 illustrates a programming circuit that optimizes the timing of individual programming pulses according to the relative number of program-enabled and program-inhibited memory cells in the page.

FIG. 12 illustrates a programming circuit that optimizes the timing of individual programming pulses according to the relative number of program-enabled and program-inhibited memory cells in the page. A programming circuit 230 includes a number of word line drivers 232 applies specified word line voltages $V_{WLs}$ to a selection of word lines 42. The selection is effected by a word line decoder (not shown). The word line driver 232 applies a specified $V_{WL}$ to the word line 42 via the access node 46. As the programming loop proceeds, each pulse can be identified by its pulse number (see FIG. 9). For a given pulse at its pulse number, a control circuitry 230, responsive to the relative number of programmed-enabled and program-inhibited memory cells at the pulse number, controls the word line driver 232 to output a word line voltage with an optimized timing for the current pulse.

The following equations will describe the variation of the effective RC of the word line with the relative numbers of program-enabled and program-inhibited memory cells in a page.

Number of NAND stings in a page=Number of memory cells in a page=$N$   Eqn (1)

Number of program-enabled memory cells in a page=$n_1$   Eqn (2)

Number of program-inhibited memory cells in a page=$n_2$   Eqn (3)

Eqn (1)-Eqn (3) give:

$N=n_1+n_2$   Eqn (4)

Effective word line $RC_{eff}=R(Cw+n_1Cs)$   Eqn (5)

Where Cw is the capacitance due to the word line and Cs is the capacitance due to a NAND string.

The largest Rcmax is when all memory cells of the page are program-enabled:

$Rc\ max=R(Cw+NCs)$   Eqn (6)

The smallest Rcmin is when all memory cells of the page are program-inhibited:

$Rc\ min=RCw$   Eqn (7)

Expressing Eqn (5) in terms of Rcmax and Rcmin using Eqn (5)-Eqn (7):

Effective word line $R_{Ceff}=(n_2/N)Rc\ min+(n_1/N)Rc\ max$   Eqn (8)

Figure 13:
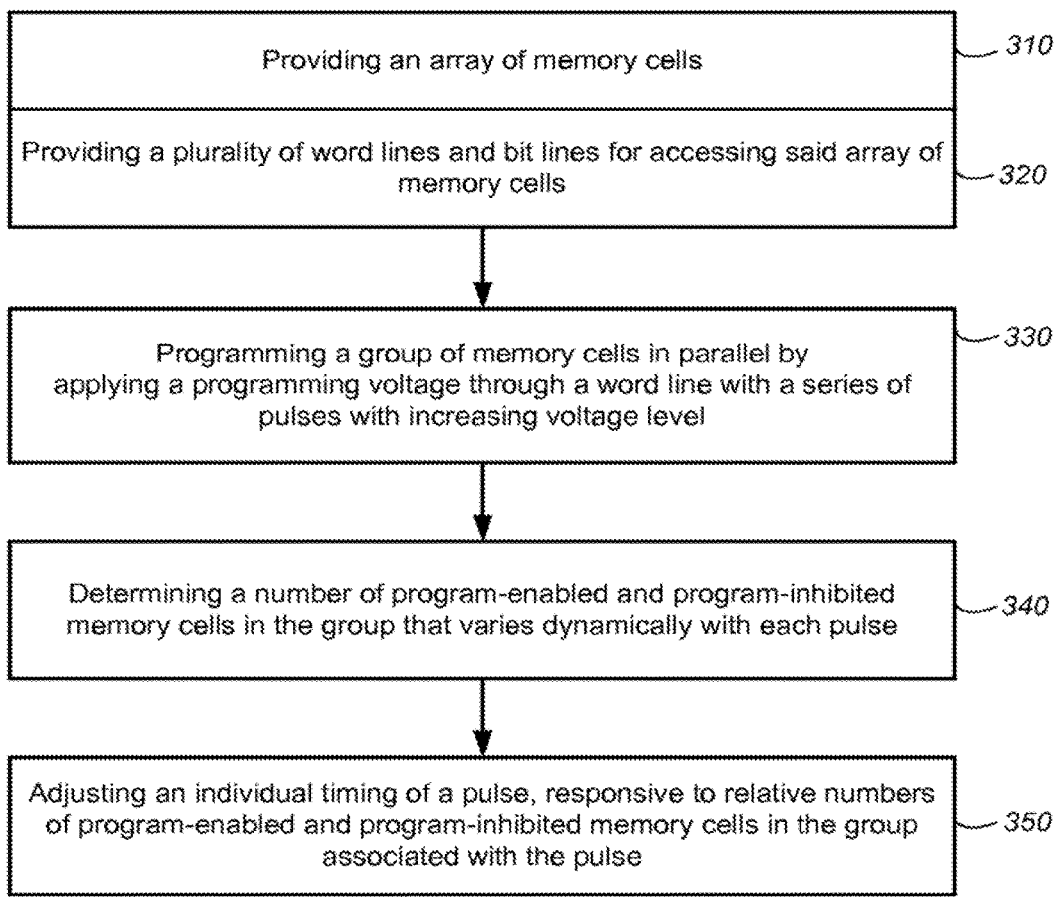
FIG. 13 is a flow chart illustrating a method of programming with adaptive timing of individual programming pulses.

FIG. 13 is a flow chart illustrating a method of programming with adaptive timing of individual programming pulses.

STEP 310: Providing an array of memory cells.

STEP 320: Providing a plurality of word lines and bit lines for accessing said array of memory cells.

STEP 330: Programming a group of memory cells in parallel by applying a programming voltage through a word line with a series of pulses with increasing voltage level.

STEP 340: Determining a number of program-enabled and program-inhibited memory cells in the group that varies dynamically with each pulse.

STEP 350: Adjusting an individual timing of a pulse, responsive to relative numbers of program-enabled and program-inhibited memory cells in the group associated with the pulse.

When the timing of the pulses is individually optimized, the overall programming time is reduced. For example, the time delays of pulses later in the series are set to less those earlier in the series, as more and more program-enabled memory cells become program-inhibited memory cells during the course of the programming. The reduced programming time also helps to reduce program disturb. This is owing to minimizing the time for the program-inhibited memory cells to hold the boosted voltage during programming, which has a tendency to leaking away, thereby reducing their program-inhibition efficacy and causing unwanted programming.

While the description of the examples above is on the timing of the programming voltage on a selected word line, the same principle of individually optimized timing applies to the timing for charging up unselected word lines. For example in a memory with NAND architecture, the unselected word lines of a NAND string are pre-charged to a predetermined voltage (Vpass) to turn on the unselected memory cells in the NAND string. The timing for precharge can also be optimized according to the relative numbers of program-enabled and program-inhibited memory cells in the group associated with the pulse at the time.

An Example of 3D Nonvolatile Memories

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 14-FIG. 17 illustrate a particular monolithic three dimensional (3D) memory array of the NAND type (more specifically of the "BiCS" type), where one or more memory device levels are formed above a single substrate, in more detail.

Figure 14:
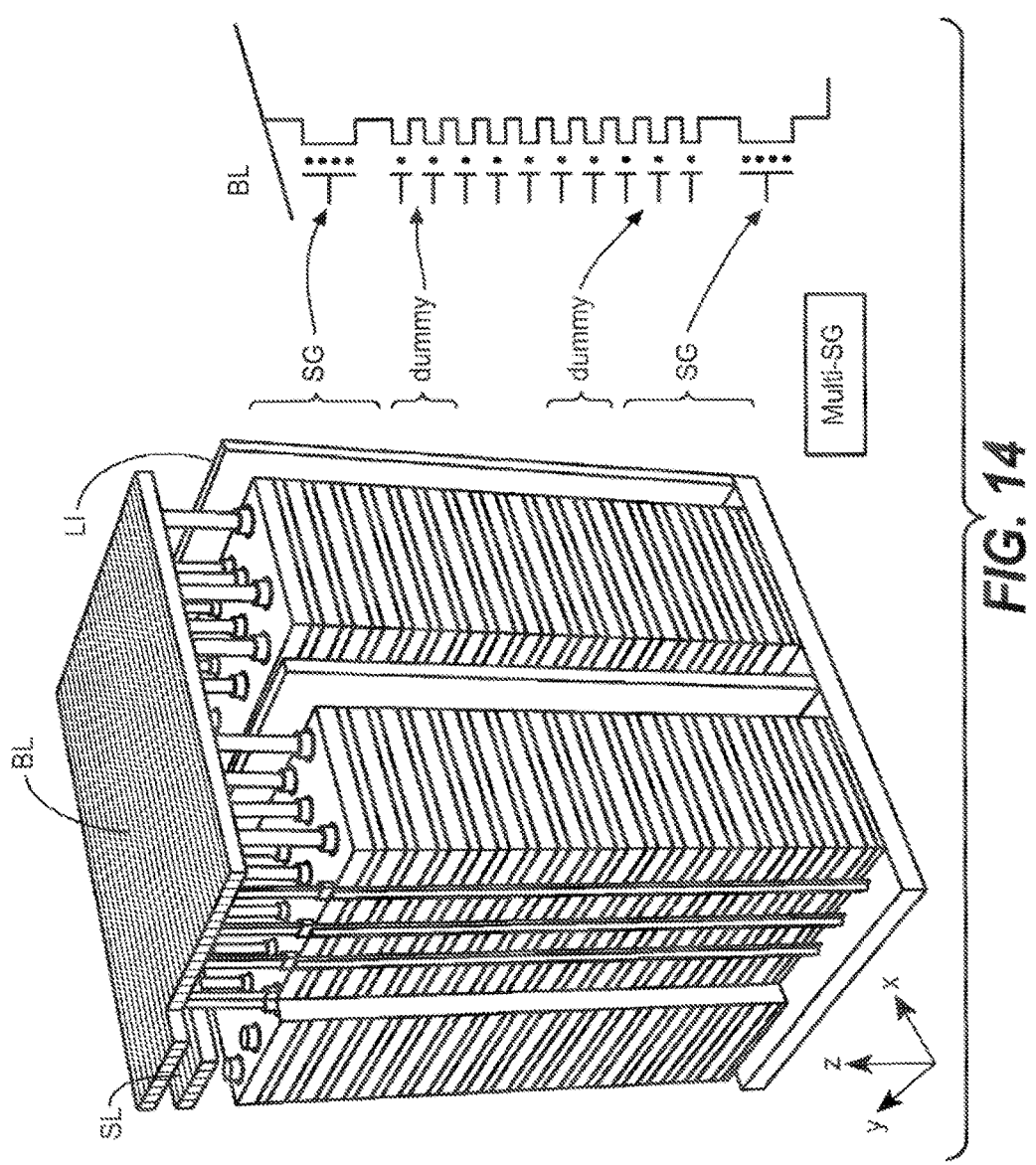
FIG. 14 is an oblique projection of part of a 3D NAND memory.

FIG. 14 is an oblique projection of part of a 3D NAND memory. FIG. 14 illustrate a portion corresponding to two of the page structures in FIG. 6, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 14 is a representation of the elements of one of the vertical NAND strings from the structure to the left. Multiple memory cells are connected through a drain select gate SGD to the associated bit line BL at the top and connected through the associated source select gate SDS to the associated local source line LI to a global source line SL. It is often useful to have a select gate with a greater length than that of memory cells, where this can alternately be achieved by having several select gates in series, making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 15:
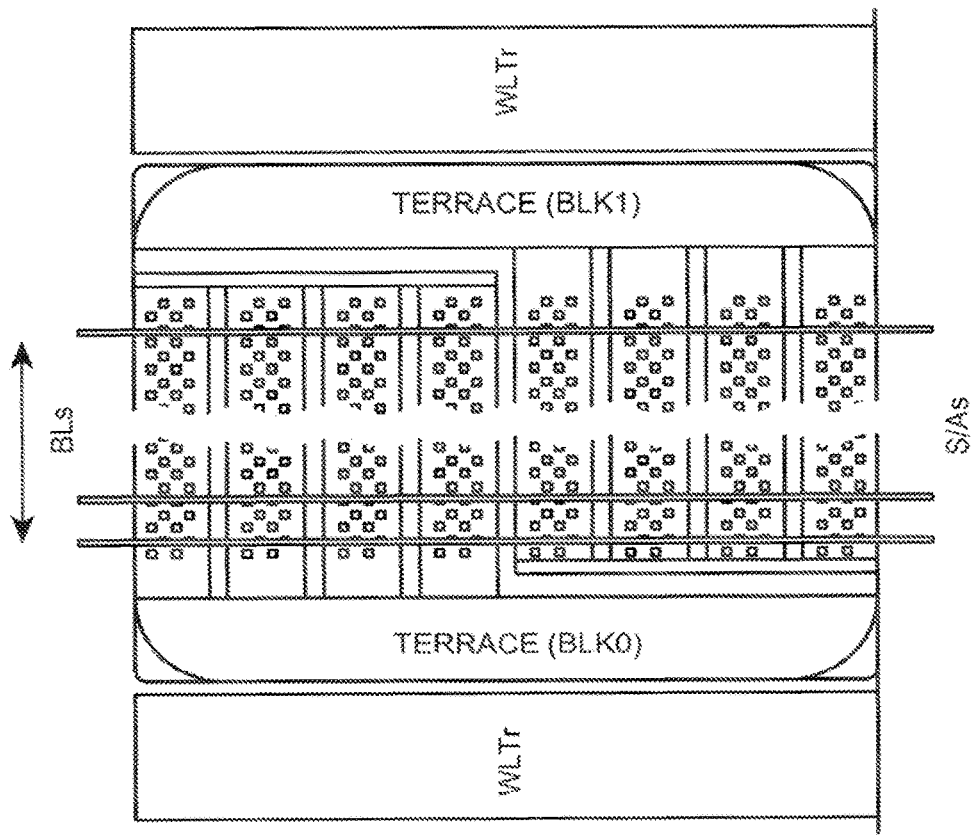
FIG. 15 shows a top view of the structure for two blocks in the exemplary embodiment.

FIG. 15 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 17:
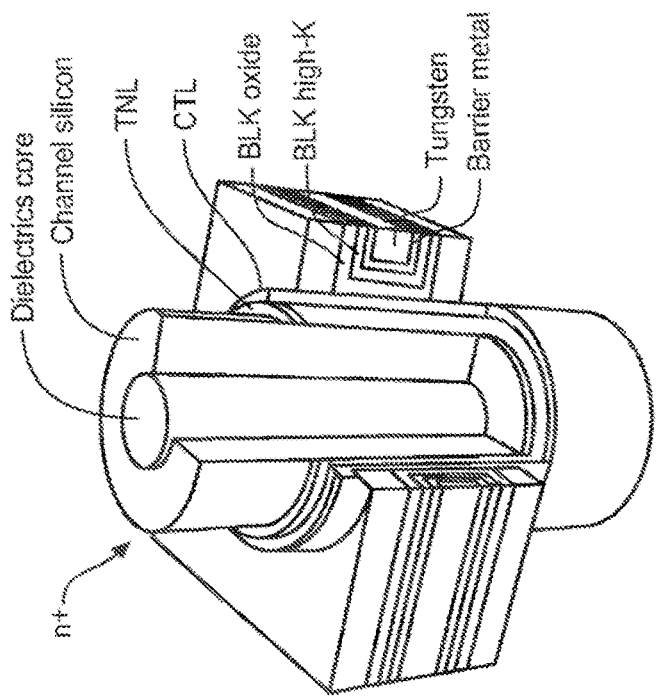
FIG. 17 illustrates some detail of an individual cell.
Figure 16:
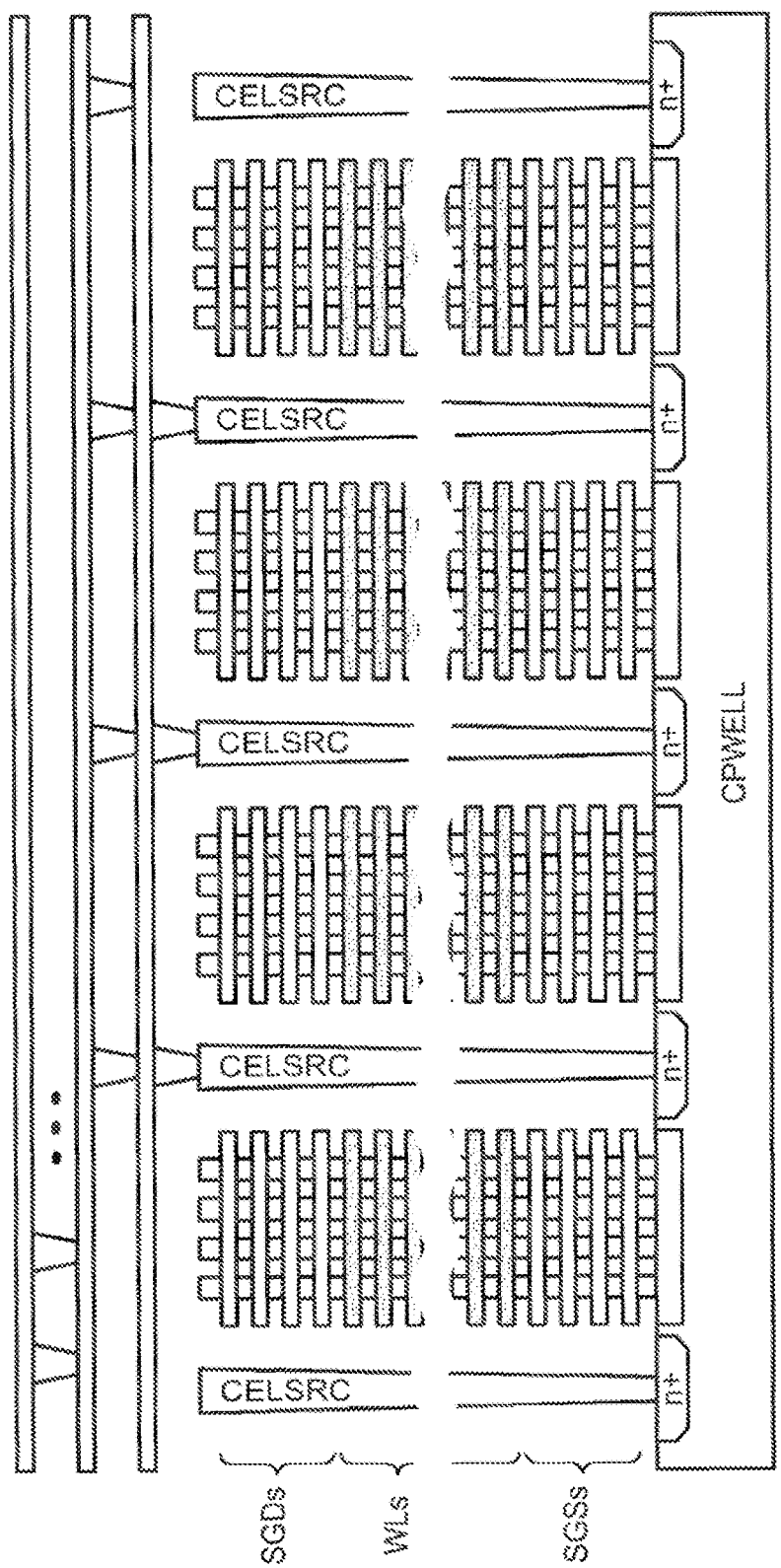
FIG. 16 shows a side view of one block, again with four fingers.

FIG. 16 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly. FIG. 17 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Programming Techniques for Cells Using Charge Trapping Layers

This section looks at the programming of multi-state (MLC) memory cells that are particularly useful when the memory cells include a charge trapping dielectric layer (CTL), such as those just described above, although they may also be implemented for floating gate memory cells. Although the following discussion is presented primarily in the context of the 3D NAND or BiCS type of memory presented in the preceding section, the concepts can also be applied to 2D architectures, such as 2D NAND using a dielectric charge storage region.

Figure 18A:
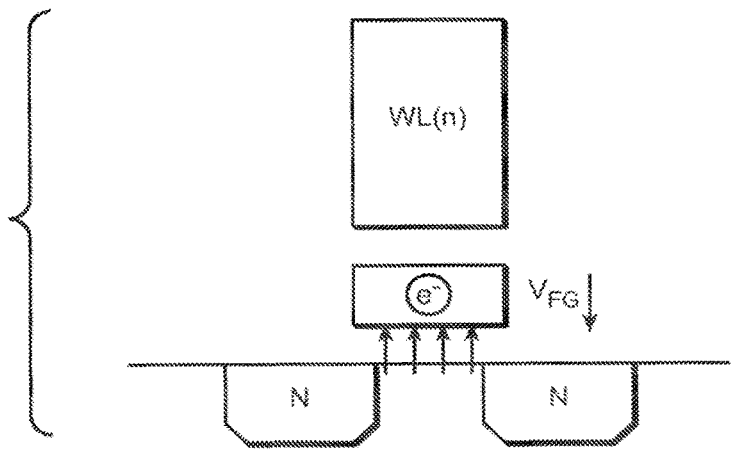
FIGS. 18A and 18B schematically representation a floating gate memory cell and the formation of a channel for the cell.
Figure 18B:
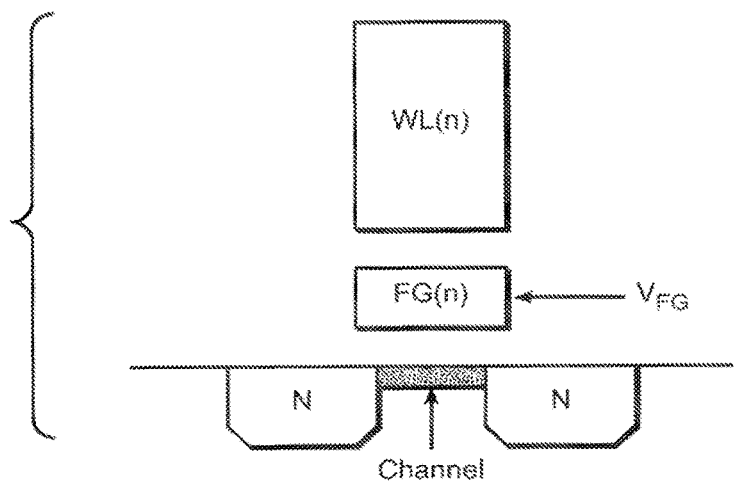

Considering programming further, FIG. 18A is a schematic representation of a floating gate memory cell in a 2D NAND structure illustrating elements similar to those of FIG. 2 for a word line n (WL(n)). In a write operation, the Floating Gate (FG) stores electrons from the substrate. The more electrons the floating gate stores, the lower the voltage in the floating gate. FIG. 18B illustrates the formation of a channel for a cell: If the voltage of the floating gate is less than the threshold voltage, $V_{FG}$<Vt, then no channel is formed; if $V_{FG}$>Vt then a channel is formed.

So the $V_{FG}$ voltage will determine if there is a channel or not. Current will only pass through if there is a channel. The more electrons the floating gate has, the lower the floating gate voltage. If the floating gate voltage is lower, it is harder to have a channel so the effective threshold voltage (Vt) of the transistor rises. Cells using a dielectric charge trapping layer (CTL) function similarly, except that the conductive floating gate is replaced the charge trapping dielectric region between the control gate and the substrate.

Figure 19:
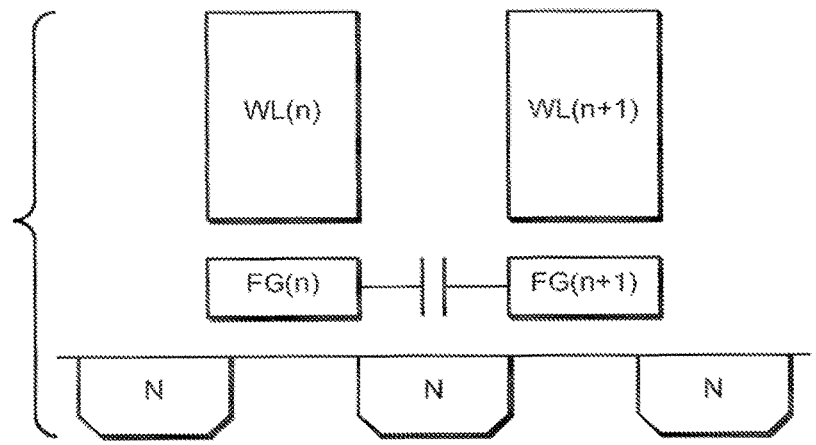
FIG. 19 schematically illustrates the capacitive coupling between the conductive floating gates of neighboring word lines.
Figure 20:
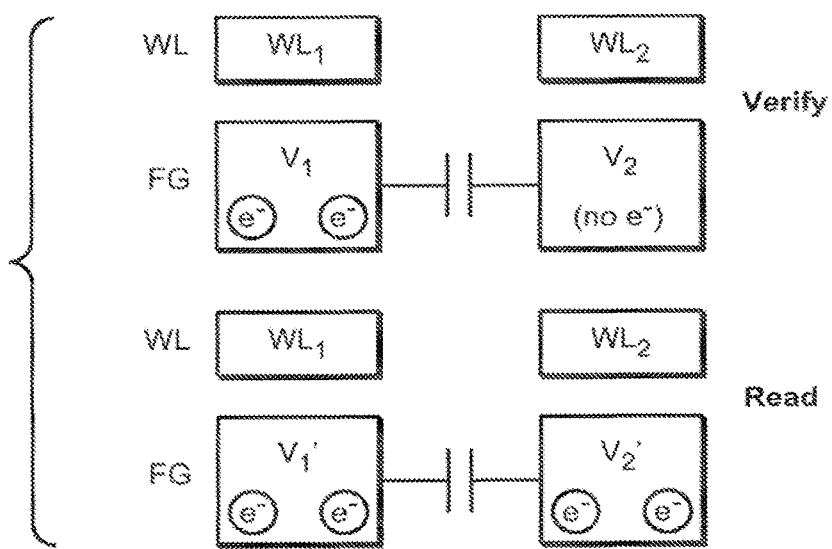
FIG. 20 looks at the Yupin effect during a verity and during a read.

The capacitive coupling between the conductive floating gates of neighboring word lines, illustrated schematically in FIG. 19, can cause the floating gate on one word line to affect the word line floating gate voltage on a selected neighboring word line, a phenomenon known as the Yupin Effect. Focusing on this floating gate to floating gate capacitance, if the floating gates of neighboring cells on word lines $WL_1$ and $WL_2$ are initially erased and then memory just programs $WL_1$ while leaving $WL_2$ erased, when performing the verify, the $WL_2$ will still be erased and having no, or at least relatively few, electrons. This is illustrated at the top of FIG. 20. When the memory then programs $WL_2$ and then subsequently performs a data read on $WL_1$, $WL_2$ is programmed so that its floating gate has electrons, as represented in the lower part of FIG. 20. This will couple down the voltage $V_{FG1}$ on the floating gate along $WL_1$ making it more difficult to create a channel so that the effective Vt along $WL_1$ rises. This causes a mismatch of the cells' Vt between verify and read. To minimize this problem, a number of techniques related to partially programming one word line, partially program later word lines, then returning to the first word line are known, such as "foggy-fine" algorithms or various ordering of writing lower, upper, and any intermediate word lines across the word lines of an array.

Figure 21:
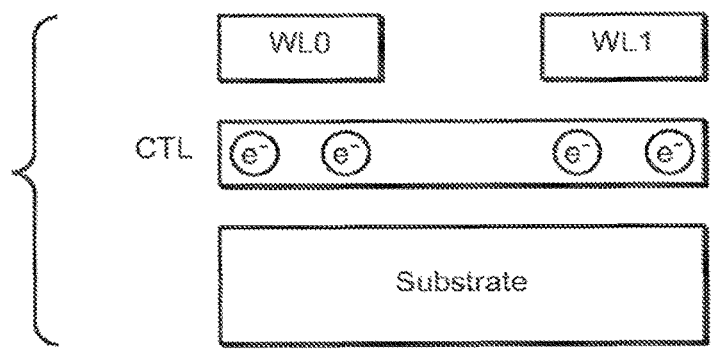
FIG. 21 considers capacitive coupling between adjacent cells using a charge trapping layer.

The situation when the memory cells use a charge trapping layer, whether in a BiCS/3D structure or a 2D array, is different than with floating gates. This is represented in FIG. 21. The Charge Trapping Layer (CTL) is made of an insulator, such as SiN, within which the trapped internal charges do not move. Therefore, even if more charge accumulates in the CTL under WL1, the electrons in the CTL under neighboring WL0 will not move and the voltage potential will not change. In order for the electrons in the CTL to move, a very high electric field is needed across these electrons, but this will only happen to a significant degree if the particular word line above those electrons is erased or programmed. The electrons in the CTL under WL1 cannot produce a high enough electric field to move the electrons in the CTL under WL0. Since the charge in an insulator does not move, then the voltage potential in the CTL under WL0 will not change even if charge accumulates in the CTL under WL1. Therefore, there is effectively no Yupin effect where the voltage potential in the CTL under the selected word line will change due to coupling from the neighbor.

Figure 22:
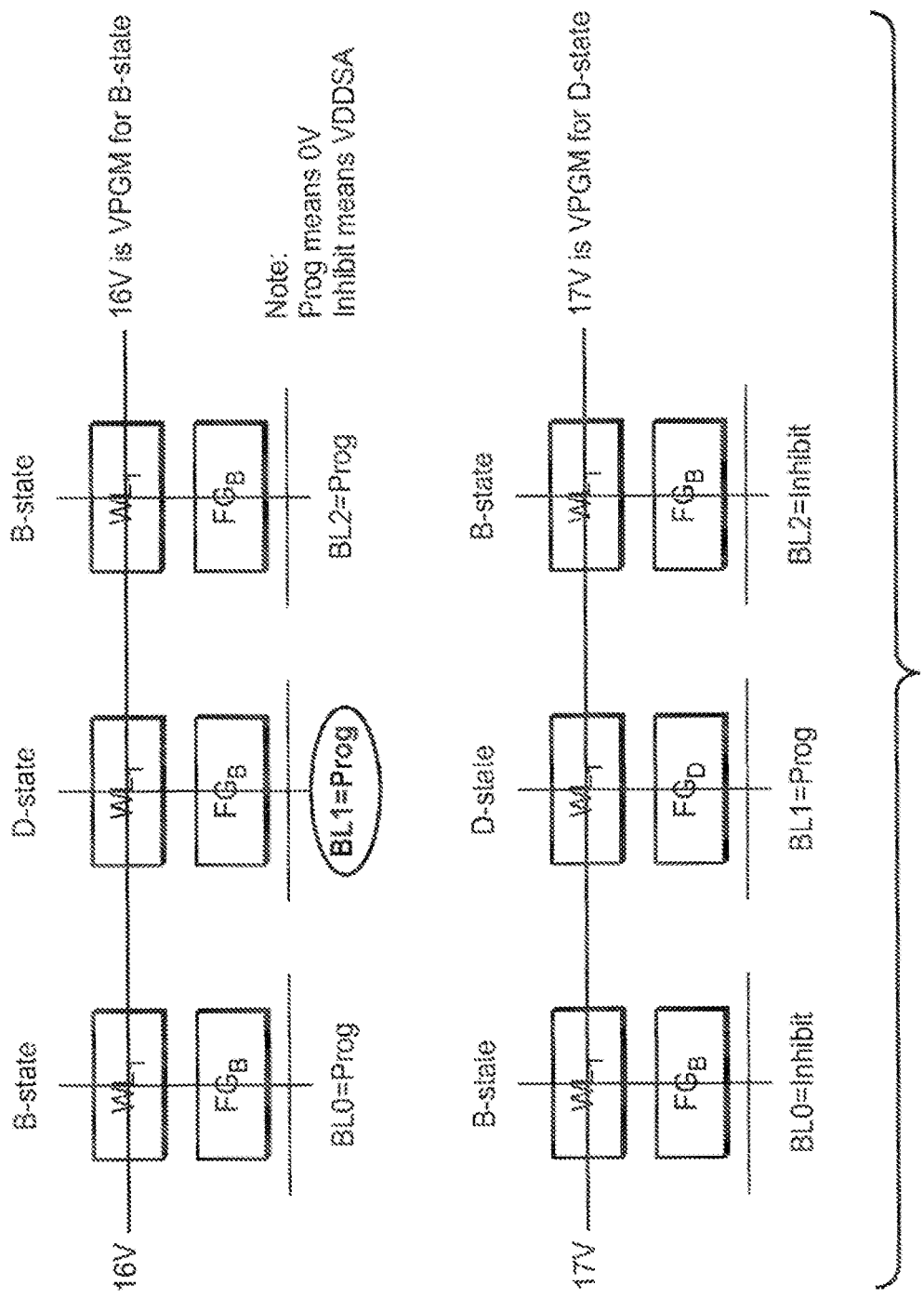
FIG. 22 illustrates a typical write process for adjacent bit lines.

As described above with respect to FIGS. 7 and 8, in multi-state programming, a higher programming voltage VPGM is needed for higher states because a higher electric field is needed to put more electrons into a floating gate or a charge trapping layer. For example, in the case of a memory storing 3-bits per cell, with the states labeled as Er, A, . . . , G in terms of increasing threshold voltages, a staircase of up to, say, 15V may be sufficient to program to the A-state while 20V is needed to program G-states. The standard programming technique is to enable the memory cells along a given word line to be programmed from the erased state ER to any of the other states, apply the programming staircase waveform, and then inhibit the cells from further programming as they verify at their respective data states. This is illustrated in FIG. 22 where along a word line ($WL_1$) a D state is being written on one bit line (BL1) while on either side (BL0, BL2) a lower B state is being written. Initially all three word lines are programmed enabled with the bit line at 0V or other low voltage, as shown at the top of FIG. 22. By the time the program staircase reaches, say, 16 V, the B states have been written. BL0 and BL2 are then set to a program inhibit voltage, typically a few volts to turn off the drain side select transistor and allow the bit line to float, while BL1 remains enabled, as shown in the lower part of FIG. 22. Once the word line voltage reaches, say, 17V for a D-state, it will verify and lock out for any subsequent pulses.

Consequently, when programming floating gate memory cells along a word line, all the cells needing to be programmed are programmed together and are only inhibited when the target state of each cell is reached. For example, the memory would not inhibit a D-state cell during B-state programming. A reason for this is that the Yupin effect, discussed above with respect to neighboring cells on different word lines also applies to neighboring cells on different bit lines of the same word line as the floating gates of these capacitively couple to neighbors in all directions. Under the standard write algorithm, when doing verify for a B-state, the D-state cell will be already be at or near B-state. During READ the D-state cell will be at D-state; but by making the D-state cell at B-state, it is closer to D-state than if D-state cell was still erased, which would be the case if the memory inhibited BL1 in FIG. 22 while writing the B state on BL0 and BL2.

Figure 23:
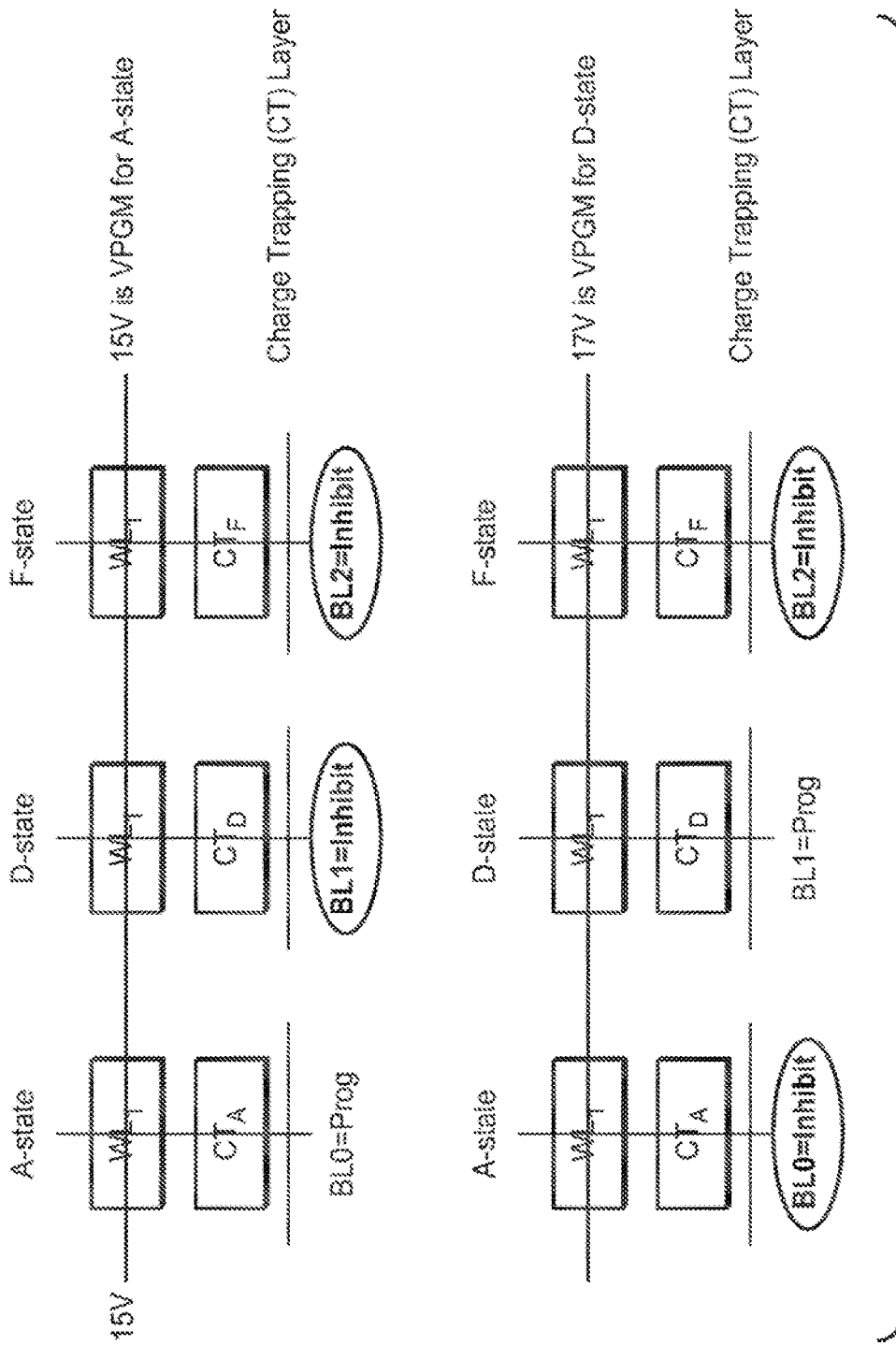
FIG. 23 illustrates the use of single state write sub-operations.

In memory structures such as BiCS or 2D dielectric memory where memory cells use a charge trapping layer, however, the Yupin effect is not such a concern. Consequently, this allows for the memory to inhibit any cell whose state is not the state the memory is currently programming. For example, if, say, 15V is for A-state programming, the memory can inhibit states B.about.G, as illustrated in FIG. 23. Subsequently, the A and F states can be inhibited while the D state programs, and so on. Additionally, this allows for the order to be rearranged, such as programming the F states prior to the D and A states. For any order this can be done starting from the erased state or from some intermediate level, such as programming all cells to be written to the A level and then individually writing the higher states. In other variations, the states could be done in sub-sets of more than one state, or the cells for a single state could be subdivided for separate programming.

Figure 24:
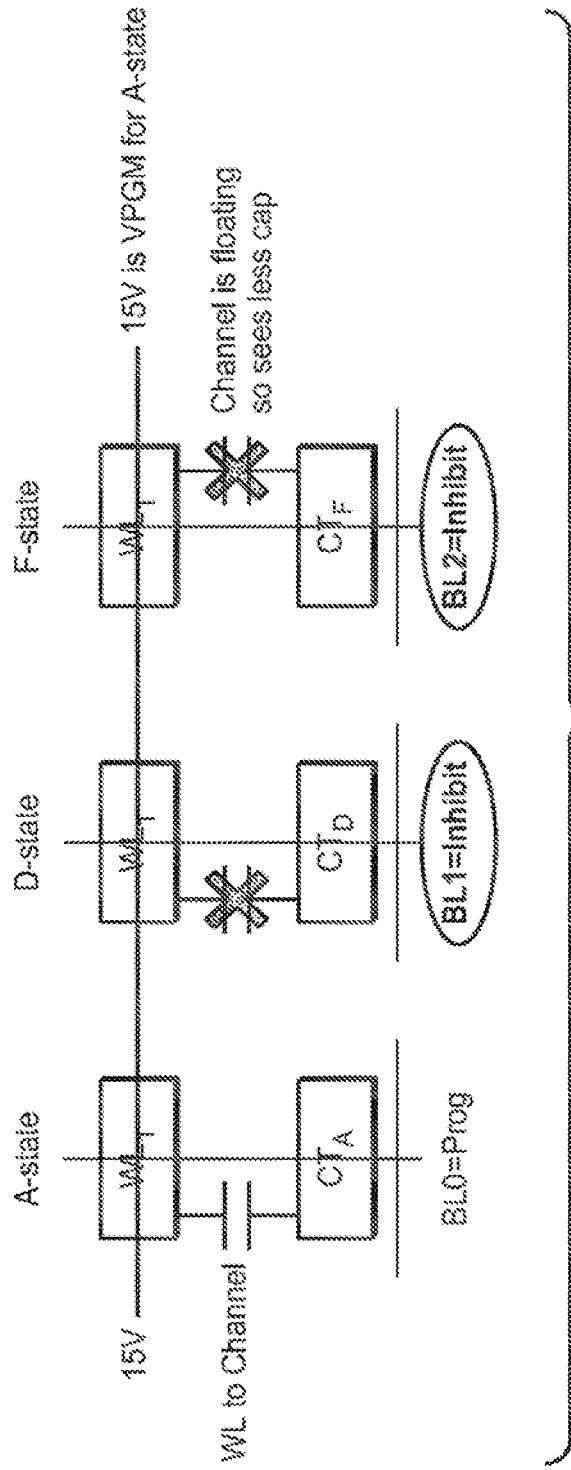
FIG. 24 illustrates reduced channel capacitance when using single state write sub-operations.

Being able to ignore the Yupin effect and program the individual data states one at a time can provide a number of advantages. As discussed further in U.S. patent application Ser. No. 14/612,010, filed Feb. 2, 2015, the RC constant of the word lines can lead to relatively high rise times, particularly at the far ends from the drivers. By inhibiting the bit lines of all cells except those of the single state currently being written, the channel under these inhibited cells is left to float, reducing the amount of capacitance from these cells to the word line as illustrated schematically in FIG. 24. A lower word line to channel capacitance results in a faster rise time for the selected word line during program because WL to Channel capacitance is less; and a faster word line rise time means a shorter program pulse can used, meaning faster performance.

In a NAND type architecture, the non-selected word lines are set to a VPASS level. Depending on the embodiment, the non-selected word lines can be raised to the final VPASS level all at once, or raised part way and then shifted up during the pulse on the selected word line, or moved in several steps in a staircase mode. As there is less word line to channel coupling with more inhibited word lines, the unselected word lines can rise more quickly. In such a VPASS shift or staircase mode where the memory raises the unselected word line, the unselected word line can couple up the channel, which couples up the selected word line, as can the word line to word line coupling between the selected word line and its neighbors. This also helps raise the selected word line faster, which means shorter program pulse, which means faster performance. Since channel is floating for inhibited bit lines, then neighboring word lines will couple up floating channel which will help couple up the selected word line. Having more inhibited bit lines makes word line rise time faster in this way as well.

A further advantage in having a lower number of enabled bit lines relates to the bit lines and a resultant power savings due to the lowered word line capacitance for both selected and unselected word lines. The greatest bit line to bit line capacitance is between an enabled and an inhibited bit line, an alternating inhibited-enabled pattern being the extreme example. By have less enabled bit lines, the extra power needed to charge up the bit lines to inhibit is smaller because most of the bit lines are charging to inhibit and therefore do not see the bit line to bit line capacitance between adjacent inhibited bit lines. Because of this the extra power to charge up bit line to the inhibit level is smaller.

Consequently, the ability to ignore the Yupin effect for memory cells using a charge trapping layer and program the different data states individually has a number of advantages. Faster word line rise times means shorter program pulse, which means faster performance, where the faster rise time is due to less word line capacitance for both the selected and unselected word lines due to reduced capacitive coupling between the channel and the selected word line and between the selected word line and its neighbors. There is also power savings due to less word line loading and due to less power being needed for charging up bit lines, as bit line capacitance is lowered by having few enable bit lines.

Relative to the single staircase waveform for all states (such as illustrated in FIG. 8), it would appear that a separate staircase for each state would lengthen the write process. However, for each single state, the full staircase is not required, so that each state can start progressively higher up the staircase and only use the next several steps. Additionally, as noted above, the pulses can be made shorter; as only a single state is being programmed, only a single verify is needed; and, particularly for higher states, it may be possible to omit some of the initial inter-pulse verifies. Further, even for the single inter-pulse verify, as fewer cells are being sensed, fewer bit lines need to be pre-charged for the sensing operation, further speeding up operations. Consequently, although a separate program sub-operation is needed for each state, these sub-programs can be relatively short. Additionally, the techniques of the preceding sections, where the timing is adapted to the numbers of inhibited/enabled bit lines/cells can also be advantageously applied in conjunction with the techniques of this section.

CONCLUSION

The foregoing detailed description has been presented for purposes of illustration and description. It is not intended to be exhaustive or to limit the above to the precise form disclosed. Many modifications and variations are possible in light of the above teaching. The described examples were chosen in order to explain the principals involved and its practical application, to thereby enable others to best utilize the various embodiments and with various modifications as are suited to the particular use contemplated. It is intended that the scope be defined by the claims appended hereto.

What is claimed is:

1. A method, comprising:
    programming a group of memory cells connected to a word line in parallel by applying a programming voltage in a series of programming pulses to the word line, wherein programming the group of memory cells further comprises:
        program-enabling a first subset of the group of memory cells;

program-inhibiting a second subset of the group of memory cells;

identifying a number of memory cells that remain program-enabled after a first programming pulse; and adjusting a timing of a second programming pulse in response to the number of memory cells that remain program-enabled after the first programming pulse, wherein adjusting the timing includes adjusting a rise time and a fall time of the second programming pulse, and wherein adjusting the timing reduces the overall programming time of the group of memory cells.

2. The method of claim 1, further comprising changing one or more memory cells of the first subset of the group of memory cells that are program-enabled to be program-inhibited after completion of the program-enabling of the first subset of the group of memory cells.

3. The method of claim 1, wherein each of the programming pulses is identified with a pulse number that increases with each subsequent instance of the programming pulses.

4. The method of claim 3, wherein as the pulse number increases, the number of memory cells of the first subset of the group of memory cells that are program-enabled decreases and a number of the second subset of the group of memory cells that are program-inhibited increases.

5. The method of claim 4, wherein, as the number of memory cells of the first subset of the group of memory cells that are program-enabled decreases, the timing of each of the programming pulses decreases.

6. The method of claim 4, wherein, as the number of memory cells of the first subset of the group of memory cells that are program-enabled decreases, a time constant of the word line decreases, and as the time constant decreases, the timing of each of the programming pulses decreases.

7. The method of claim 6, wherein the time constant is computed as a product of an effective capacitance of the word line and a resistance of the word line, and wherein the effective capacitance is a sum of a capacitance of the word line and a capacitance of the first subset of the group of memory cells that are program-enabled.

8. The method of claim 6, wherein the time constant decreases based upon a decrease in an effective capacitance of the word line as the number of memory cells of the first subset of the group of memory cells that are program-enabled decreases.

9. The method of claim 1, wherein a word line driver of a programming circuit applies the programming voltage to the word line.

10. The method of claim 9, wherein the word line applies the programming voltage to an access node connected to the word line.

11. A memory comprising:
a plurality of memory cells connected to a word line, wherein each of the plurality of memory cells is either program-enabled or program-inhibited;
a programming circuit having a word driver connected to the word line via an access node; and
control circuitry connected to the programming circuit, wherein the control circuitry causes the word driver to output a programming voltage on the word line through the access node, wherein the programming voltage is associated with a programming pulse having a timing value, and wherein the timing value in the programming pulse is based upon a relative number of the program-enabled memory cells and the program-inhibited memory cells.

12. The memory of claim 11, wherein the number of the program-enabled memory cells decreases and the number of the program-inhibited memory cells increases as a number of the programming pulse increases.

13. The memory of claim 12, wherein the control circuitry computes the timing value using a time constant of the word line, and wherein as the number of the program-enabled memory cells decreases, the time constant decreases and the timing value decreases.

14. The memory of claim 13, wherein the timing constant is a function of an effective capacitance of the word line that is computed as a sum of a capacitance of the word line and a capacitance of all of the program-enabled memory cells, and wherein the effective capacitance decreases as the number of the program-enabled memory cells decreases.

15. A method, comprising:
programming, by a programming circuit, a group of memory cells in parallel by applying a programming voltage with a series of programming pulses and increasing voltage level through a word line, wherein the word line is connected to the group of memory cells;
receiving, by a control circuitry, a determination of a number of program-enabled memory cells and program-inhibited memory cells in the group, wherein the number of the program-enabled memory cells increases and the number of the program-inhibited memory cells decreases as a number associated with the programming pulses increases; and
adjusting, by the control circuitry, a timing of each of the programming pulses based upon a number of the program-enabled memory cells to be programmed with that programming pulse, wherein as the number of the program-enabled memory cells decreases, the timing of the programming pulses decreases.

16. The method of claim 15, wherein the programming voltage is applied to the word line by a word line driver connected to the word line via an access node.

17. The method of claim 15, wherein as the number of the program-enabled memory cells decreases, an effective capacitance of the word line decreases.

18. The method of claim 17, wherein as the effective capacitance decreases, a time constant of the word line decreases, causing a decrease in the timing of the programming pulses.

19. The method of claim 15, wherein a resistance of the word line is substantially constant.

20. The method of claim 15, further comprising adjusting the timing of each of the programming pulses until all of the memory cells become program-inhibited.

* * * * *